United States Patent [19]

Face

[11] Patent Number: 5,389,606
[45] Date of Patent: Feb. 14, 1995

[54] PROCESS FOR PRODUCING THIN FILMS OF INORGANIC OXIDES OF CONTROLLED STOICHIOMETRY

[75] Inventor: Dean W. Face, Wilmington, Del.

[73] Assignee: E. I. du Pont de Nemours and Company, Wilmington, Del.

[21] Appl. No.: 151,236

[22] Filed: Nov. 12, 1993

Related U.S. Application Data

[63] Continuation-in-part of Ser. No. 984,134, Dec. 9, 1992, abandoned, which is a continuation-in-part of Ser. No. 850,621, Mar. 16, 1992, abandoned.

[51] Int. Cl.$^6$ .................... C23C 14/00; B05D 5/12
[52] U.S. Cl. .................... 505/473; 505/474; 505/475; 505/476; 505/730; 505/731; 505/732; 427/62; 427/596; 427/126.3; 427/314; 204/192.24; 204/192.15
[58] Field of Search ............... 505/1, 730, 731, 732, 505/783, 474, 475, 476, 473; 427/62, 63, 126.3, 314, 596; 204/192.24, 192.15

[56] References Cited

U.S. PATENT DOCUMENTS

4,968,665 11/1990 Ohuchi et al. .................... 505/1

FOREIGN PATENT DOCUMENTS

| | | | |
|---|---|---|---|
| 285999 | 10/1988 | European Pat. Off. | C23C 14/08 |
| 3726016 | 2/1989 | Germany | C23C 14/08 |
| 3734069 | 4/1989 | Germany | C23C 16/40 |
| 3827069 | 6/1989 | Germany | C23C 16/40 |
| 3822502 | 8/1989 | Germany | C23C 14/08 |
| 4006489 | 9/1991 | Germany | C23C 16/40 |

OTHER PUBLICATIONS

W. L. Holstein et al., HTS TlBaCaCuO Thin Film Fabrication Interim Technical Report (Oct. 1990–Dec. 1991) submitted Jan. 25, 1992., pp. 1–91.
Shah et al., *Appl. Phys. lett.*, 56(8), pp. 782–784, Feb. 1990.
Lin et al., *Jpn. J. Appl. Phys..*, 28(1), L85–L87, Jan. 1989.
Shih et al., *Appl. Phys. lett.*, 56(6), pp. 523–525, Aug. 1988.
Takano et al., *Appl. Phys. lett.*, 55(8), pp. 798–800, Aug. 1989.
Subramanian et al., *Science*, vol. 242, pp. 249–252, Oct. 1988.
Face et al., *Appl. Phys. Lett.*, 61(15), pp. 1838–1840, Oct. 1992.
Ganne et al., *Mat. Res. Bull.*, vol. 10, pp. 1313–1318, 1975.
Kajimura et al., Proceedings of the 3rd International Symposium on Superconductivity (ISS '90), Nov. 6–9, 1990, Sendai P.
Maissel et al., *Handbook of Thin Film Technology*, 1970, pp. 1–96 to 1–113 and 8–3 to 8–21, McGraw Hill Book Co., New York, N.Y.
Goodenough et al., Numerical Data and Functional Relationships in Science and Technology, Hellwege, Ed., vol. 4, 1970, pp. 176–196, Springer-Verlag, New York, N.Y.
Subramanian et al., *Prog. Solid St. Chem.*, vol. 15, pp. 55–143, 1983.

*Primary Examiner*—Roy V. King

[57] ABSTRACT

An in-situ process for preparing thin films which contain relatively volatile and involatile oxides is disclosed, in particular, crystalline thin films of oxides of conductors, superconductors or ferroelectric materials, wherein separate sources of the relatively volatile and involatile oxides during depositon of the thin film are employed.

12 Claims, 9 Drawing Sheets

PROCESS FOR PRODUCING THIN FILMS OF INORGANIC OXIDES OF CONTROLLED STOICHIOMETRY

GOVERNMENT FUNDING

This work was performed in part under funding from Wright-Patterson Air Force Base. The United States Federal Government may have license rights to the invention claimed herein.

This is a continuation-in-part of application Ser. No. 07/984,134, filed Dec. 9, 1992, now abandoned, which is a continuation-in-part of application Ser. No. 07/850,621, filed Mar. 16, 1992, now abandoned.

FIELD OF THE INVENTION

This invention relates to methods for producing thin films of inorganic oxides, such as high temperature superconducting oxides.

BACKGROUND OF THE INVENTION

Thin-films have been prepared by a number of deposition methods including evaporation, sputtering, laser ablation, and metallo-organic chemical vapor deposition (MOCVD), see, for example, "Thin Film Processes II", (J. L. Vossen and W. Kern, eds.), Academic Press, New York, 1991; "Handbook of Thin Film Technology" (L. I. Maissel and R. Glang, eds.) McGraw Hill, New York, 1970, and R. W. Simon, Solid State Technology, p. 141, September, 1989.

The thin film deposition processes of the prior art typically depend on the substrate temperature. When the temperature of the substrate onto which a thin film such as $YBa_2Cu_3O_{7-x}$ is being deposited is low, the resulting film is amorphous and insulating. A high-temperature post-deposition anneal at 800°–900° C. in oxygen is required to convert the amorphous precursor film into a super-conducting film with the correct crystal structure. This two-step process is referred to as a "post-anneal" process. However, when a thin-film such as $YBa_2Cu_3O_{7-x}$ is deposited onto a substrate heated to about 550°–750° C., the resulting thin-film is crystalline and superconducting as deposited. This process is referred to as an "in-situ" process.

Films produced by an in-situ process have less surface roughness and generally superior properties when compared to films from a post anneal process. In-situ deposition has the added advantage of lower processing temperature requirements which makes in-situ deposition compatible with a wider variety of substrate materials.

In-situ processes require heating the substrate uniformly and reproducibly to the required deposition temperature. These methods involve direct thermal and mechanical anchoring of the substrates to a heated block as discussed in R. W. Simon, SPIE Proceedings Vol. 1187, p. 2, edited by T. Venkatesan, published by SPIE Bellingham, WA (1989). The heated block is made of a material that is compatible with an oxygen atmosphere and has good thermal conductivity such as nickel. Good thermal contact between the substrate and the block is usually provided by a compound with high thermal conductivity such as silver paste.

The methods of the prior art have been useful to provide thin films of oxides of relatively involatile oxides (as defined below). The prior art methods of forming in-situ films by vapor deposition onto substrates heated to elevated temperatures, however, tend to cause loss of volatile oxides from the film during the deposition. The resulting film tends to lack sufficient volatile oxide to produce the desired stoichiometry and crystal structure. Although substrates heated to lower temperatures may be employed during deposition, the films deposited on those substrates are amorphous and therefore must be subjected to an additional annealing step subsequent to deposition.

A need therefore exists for a method of producing in-situ thin films of materials that comprise volatile oxides but which avoids the disadvantages of the prior art methods.

SUMMARY OF THE INVENTION

This invention comprises an in-situ process for preparing thin films of material containing relatively volatile and involatile oxides which employs separate sources of the relatively volatile and involatile oxides during depositon of the thin film. In particular, the process may be employed to prepare in-situ, crystalline thin films of oxide superconductors, ferroelectrics, and conductors. In-situ crystalline thin films of oxides that include both involatile oxides as well relatively volatile oxides that tend to be lost from the thin film during its formation by vapor deposition are produced. The process also enables deposition on substrates heated to relatively low temperatures to provide a crystalline thin film.

Thus, the present invention comprises a method of forming in-situ crystalline thin films of formula $A_yB_z$ wherein A and B are each independently oxides, y is the number of moles of oxide A, and z is the number of moles of oxide B, wherein oxide A is a relatively volatile oxide that is susceptible to evaporative loss from said thin film during vapor deposition, wherein oxide B is an involatile oxide, wherein oxide A and oxide B have deposition rates such that the deposition rate of oxide A is at least 1.1 times the product of the deposition rate of oxide B times the stoichiometric ratio y/z of oxide A to oxide B, comprising providing a first source of said oxide A, providing a second source of said oxide B, depositing said oxide B from said second source onto a substrate while concurrently depositing a sufficient amount of said oxide A from said first source onto said substrate to provide crystalline thin film of formula $A_yB_z$.

DETAILED DESCRIPTION OF THE INVENTION

Figure 1A:
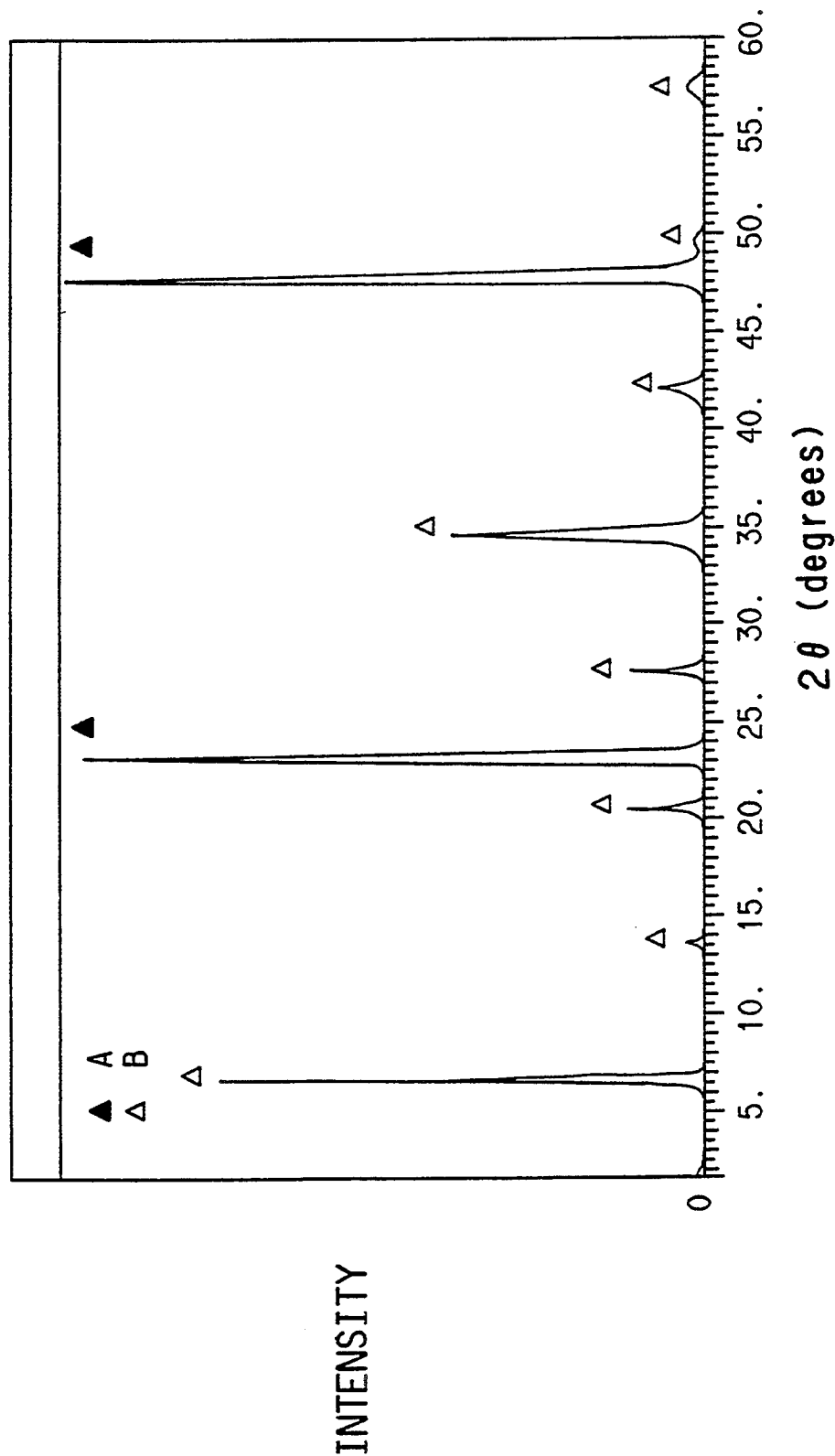
FIGS. 1a and 1b show an x-ray diffraction pattern on a linear (FIG. 1a) and a log (FIG. 1b) scale of a "phase pure" $TlBa_2CaCu_2O_7$ film made by the present invention.

In the following detailed description, unless otherwise specified, all percentages are by weight and all temperatures are in degrees Celsius.

Relatively volatile and involatile oxides are defined as follows. A thin film in accordance with this invention can generally be characterized by the general formula $$A_yB_z$$

where "y" is the relative number of moles of oxide A and "z" is the relative number of moles of oxide B, wherein oxide B can be a single or multicomponent oxide, required to form the desired stoichiometric compound relative to A and B per se. In some cases, additional oxygen may be required to satisfy the stoichiometry. When "A" and "B" are involatile oxides, stoichiometric thin film growth requires that $$[d(A)/dt] = [d(B)/dt] \times (y/z)$$

where [d(A)/dt] and [d(B)/dt] are the relative deposition rates of A and B in units of moles/cm²/second.

When oxide A is relatively volatile compared to oxide B, it evaporates from the surface of the growing film and causes the actual stoichiometry of the film ($A_{y'}B_z$) to deviate significantly from the ideal $A_yB_z$ stoichiometry. For example, in the case of a $TlBa_2CaCu_2O_7$ film, A is [$Tl_2O$], B is [$Ba_2CaCu_2O_5$], y=½ and z=1. To compensate for this evaporation effect, the deposition rate of the relatively volatile oxide A must be increased to a rate greater than $[d(B)/dt] \times (y/z)$.

The deposition rate, as used herein, means the rate at which the oxide is deposited on the substrate without considering re-evaporation from the substrate, see for example pgs. 8-14 to 8-26 in "Handbook of Thin Film Technology", (L. I. Maissel and R. Glang, eds.) McGraw Hill, New York, 1970.

In accordance with this invention, for oxide A to be a relatively volatile oxide compared to oxide B, the deposition rate of oxide A must be at least 1.1 times as great, preferably twice as great, and more preferably more than a factor of two greater than $[d(B)/dt] \times (y/z)$, i.e., the deposition rate of oxide B times the stoichiometric ratio of oxide A to oxide B to obtain the desired stoichiometric film of composition $A_yB_z$ under the desired deposition conditions (i.e., for a given substrate temperature, background gas pressure, and total deposition rate).

In a prefered embodiment of this invention, oxide A is an oxide of an element selected from the group consisting of Tl (e.g., $Tl_2O$, $Tl_2O_3$, $Tl_3O_4$, etc.), Pb (e.g., PbO, $PbO_2$, $Pb_3O_4$, $Pb_2O$, $Pb_2O_3$, etc.), Hg (e.g., $Hg_2O$, $HgO_2$, HgO, etc.), As (e.g., $As_2O_3$, $As_2O_5$, $As_2O_4$, etc.), Cs (e.g., $Cs_2O$, $Cs_2O_3$, $Cs_2O_2$, $CSO_2$, $CSO_3$, etc.), P (e.g., $P_2O_5$, $P_2O_3$, etc.), Li (e.g., $Li_2O$, etc.), K (e.g., $K_2O$, KO, $KO_2$, etc.), Rb (e.g., $Rb_2O_3$, RbO, $Rb_2O$, $RbO_2$, etc.), Se (e.g., $SeO_2$, $SeO_3$, etc.), Na (e.g., $Na_2O$, $NaO_2$, $Na_2O_2$, etc.), S (e.g., $SO_2$, SO, $SO_4$, $SO_3$, etc.), Ga (e.g., $Ga_2O$, $Ga_2O_3$, etc.); and oxide B would contain an oxide of at least one of the elements selected from the group consisting of; Be (e.g., BeO, $B_2O_3$, etc.), Mg (e.g., MgO, etc.), Al (e.g., $Al_2O_3$, etc.), Si (e.g., $SiO_2$, SiO, etc.), Ca (e.g., CaO, etc.), Sc (e.g., $Sc_2O_3$, etc.), Ti (e.g., $TiO_2$, $Ti_2O_3$, etc.), V (e.g., $V_2O_5$, VO, $VO_2$, etc.), Cr (e.g., $CrO_2$, $CrO_2$, $Cr_2O_3$, etc.), Mn (e.g., MnO, $Mn_2O_3$, $Mn_3O_4$, $MnO_2$, etc.), Fe (e.g., FeO, $Fe_2O_3$, $Fe_3O_4$, etc.), Co (e.g., CoO, $Co_2O_3$, $Co_3O_4$, etc.), Ni (e.g., NiO, $Ni_2O_3$, etc.), Cu (e.g., CuO, $CuO_2$, $Cu_2O$, $Cu_4O_3$, etc.), Sr (e.g., SrO, $SrO_2$, etc.), Y (e.g., $Y_2O_3$, etc.), Zr (e.g., $ZrO_2$, etc.), Nb (e.g., $Nb_2O_5$, NbO, $Nb_2O_3$, $NbO_2$, etc.), Mo (e.g., $MoO_3$, $MoO_2$, $Mo_2O_3$, $Mo_2O_5$, etc.), Ru (e.g., $RuO_2$, $RhO_2$, $Rh_2O_3$, etc.), Pd (e.g., PdO, $PdO_2$, etc.), Ag (e.g., $Ag_2O$, $Ag_2O_3$, $Ag_3O_4$, etc.), Cd (e.g., CdO, $CdO_2$, etc.), In (e.g., InO, $In_2O_3$, $In_2O$, etc.), Sn (e.g., SnO, $SnO_2$, $Sn_3O_4$, $Sn_2O_3$, etc.), Sb (e.g., $Sb_2O_4$, $Sb_2O_5$, $Sb_2O_3$, etc.), Ba (e.g., BaO, $BaO_2$, etc.), La (e.g., $La_2O_3$, etc.), Ce (e.g., $CeO_2$, etc.), Pr (e.g., $Pr_2O_3$, $PrO_2$, etc.), Nd (e.g., $Nd_2O_3$, etc.), Sm (e.g., $Sm_2O_3$, etc.), Eu (e.g., $Eu_2O_3$, etc.), Gd (e.g., $Gd_2O_3$, etc.), Tb (e.g., $Tb_2O_3$, $Tb_4O_7$, etc.), Dy (e.g., $Dy_2O_3$, etc.), Ho (e.g., $Ho_2O_3$, etc.), Er (e.g., $Er_2O_3$, etc.), Tm (e.g., $Tm_2O_3$, etc.), Yb (e.g., $Yb_2O_3$, etc.), Lu (e.g., $Lu_2O_3$, etc.), Hf ($HfO_2$, etc.), Ta (e.g., $Ta_2O_5$, etc.), W (e.g., $WO_3$, $WO_2$, $W_2O_5$, etc.), Re (e.g., $ReO_2$, $Re_2O_7$, $ReO_3$, etc.), Os (e.g., $OSO_2$, etc.), Ir (e.g., $IrO_2$, $Ir_2O_3$, etc.), U (e.g., $UO_2$, etc.). It is understood that the oxides listed above may contain some portion of mixed oxides, but are still within the scope of starting materials useful in the practice of this invention.

In accordance with this invention, the above oxides preferably form a product with a perovskite-related structure (as defined in "Crystallographic and Magnetic Properties of Perovskite and Perovskite-Related Compounds" by Goodenough and Longo, Vol. 4 Part a, in the series "Landolt-Börnstein, Numerical Data and Functional Relationships in Science and Technology", K. -H. Hellwege and A. M. Hellwege, eds., Springer-Verlag, New York, 1970, Chapter 3, pages 126-193) or a Pyrochlore structure (as defined in the article "Oxide Pyrochlores—A Review", by M. A. Subramanian, G. Aravamudan, and G. V. Subba Rao, in Prog. Solid St. Chem., Vol. 15, pp. 55-143, 1983). Examples of products with the perovskite-related structure include $KNbO_3$, $Pb(Zr_{1-x}Ti_x)O_3$ wherein x=0 to 1, $TlBa_2Ca_{n-1}Cu_nO_{2n+3}$, where n=1, 2, 3 or 4; $Tl_2Ba_2Ca_{n-1}Cu_nO_{2n+4}$, where n=1, 2, 3 or 4; and $Tl_{0.5}Pb_{0.5}Sr_2Ca_{n-1}Cu_nO_{2n+3}$, where n=1, 2 or 3. Examples of products with the pyrochlore structure include $Tl_2Ta_2O_6$, $Hg_2V_2O_7$, and $Tl_2Ru_2O_7$.

In another prefered embodiment of this invention, the products of the process of the present invention are oxides where at least one of the relatively volatile oxides is selected from oxides of Pb and Tl (e.g. $PbTiO_3$, $PbZrO_3$, $Tl_2Ta_2O_6$, $TlBa_2CaCu_2O_7$, or $Tl_{0.5}Pb_{0.5}Sr_2CaCu_2O_7$) where the Tl and/or Pb-containing oxides can, optionally, have the perovskite-related or pyrochlore crystal structure.

In another preferred embodiment of this invention, the products of the process of the present invention are oxides which exhibit either superconducting properties, ferroelectric properties, or conducting properties (i.e., exhibit a resistivity <100 Ωcm at 300K) where such oxides may, optionally, contain Tl and/or Pb as relatively volatile oxides and/or optionally have the perovskite-related or pyrochlore crystal structure.

In accordance with the present invention, separate sources of the relatively volatile oxides and the involatile oxides of the film material are employed during vapor deposition of the material onto a substrate. The sources of volatile and/or involative oxides need not contain oxygen per se, so long as the species produced therefrom can be converted to an oxide, such as by reacting with oxygen in the deposition atmosphere, or can be converted to an oxide at the surface of the growing film, such as by reacting with oxygen at the surface of the film. Control of the amount of volatile oxide in the film is achieved by varying the substrate temperature, the composition of the atmosphere employed during vapor deposition, and rate of deposition of the volatile oxides onto the substrate.

Control of substrate temperature, choice of atmosphere, as well as the rate of deposition of the volatile oxides depends on the composition desired in the film. Generally, the volatile and involatile oxide components of the film are placed into an atmosphere of a mixture of an inert gas and an additional gaseous component for deposition onto the substrate. The atmosphere selected depends on the composition sought in the resultant film. Typically, where the film to be formed is an oxide, the additional gaseous component is an oxygen containing gas such as oxygen. Although the percentages of inert gas and the additional gaseous component may vary, a sufficient amount of inert gas should be present to enable deposition of the oxides on the substrate. The partial pressure of the additonal gaseous component is sufficient to reduce evaporation of the volatile oxide from the film. Accordingly, where oxide films of Tl—Ba—Ca—Cu or Tl—Pb—Sr—Ca—Cu are to be formed, such as oxide films of $TlBa_2CaCu_2O_7$, $TlBa_2Ca_2Cu_3O_9$, $Tl_2Ba_2CaCu_2O_8$, $Tl_2Ba_2Ca_2Cu_3O_{10}$, $TlBa_2(Ca_{1-x}Y_x)Cu_2O_7$ wherein x is 0 to 0.6, or $Tl_{0.5}Pb_{0.5}Sr_2Ca_{n-1}Cu_nO_{2n+3}$, where n=1, 2 or 3, the additional gaseous component in the atmosphere is oxygen. The partial pressure of oxygen in that atmosphere may vary from about 3 to about 133 Pa (0.5 mtorr to 1 torr), preferably about 13 Pa (100 mtorr) in order to reduce evaporation of $Tl_2O$ from the film being deposited.

The substrate temperature employed during deposition of the film also depends on the composition of the film to be deposited. Generally, the temperature is sufficient to cause growth of the desired compositon but less than that which might cause the film to be deficient in the volatile oxide species. Accordingly, where the film to be deposited is a Tl—Ba—Ca—Cu oxide such as $TlBa_2Ca_2Cu_2O_7$, $TlBa_2Ca_2Cu_3O_9$, $Tl_2Ba_2CaCu_2O_8$, $Tl_2Ba_2Ca_2Cu_3O_{10}$, and $TlBa_2(Ca_{1-x}Y_x)Cu_2O_7$ where x is 0 to 0.6, substrate temperatures of from about 400° C. to about 700° C. preferably about 550° C. may be employed. Similar temperatures are also appropriate for the growth of ferroelectric thin films of $Tl_2Ta_2O_6$ and $Pb(Zr_{1-x}Ti_x)O_3$ wherein x=0 to 1 are employed or conducting films of $Tl_{0.5}Pb_{0.5}Sr_2CuO_5$.

Similarly, the rate of deposition of the volatile oxide species depends on the material to be deposited. Generally, the rate of depositon of the volatile oxide species is at least 1.1 times greater, preferably at least twice as great as, and more preferably more than a factor of two greater than the rate of deposition of the relatively involatile oxide or oxides times the stoichiometric ratio of volatile to relatively involatile oxide or oxides during deposition. Where the film material to be deposited is a Tl—Ba—Ca—Cu oxide or Tl—Pb—Sr—Ca—Cu oxide such as $TlBa_2CaCu_2O_7$, $TlBa_2Ca_2Cu_3O_9$, $Tl_2Ba_2CaCu_2O_8$, $Tl_2Ba_2Ca_2Cu_3O_{10}$, $TlBa_2(Ca_{1-x}Y_x)Cu_2O_7$ where x=0 to 0.6, or $Tl_{0.5}Pb_{0.5}Sr_2Ca_{n-1}Cu_nO_{2n+3}$, where n=1, 2 or 3, a minimum deposition rate of the volatile Tl oxide is about 10 nm/hour, preferably about 360 nm/hour.

The involatile oxides to be deposited can be provided in several well known ways. For example, when the sources of involatile oxides are inorganic oxides, radio frequency sputtering or laser ablation of the inorganic oxide can be used to provide the involatile oxide. Preferably, radio frequency sputtering is employed. If the sources of nonvolatile oxides are organometallic compounds, the compounds are volatilized and the organic component thereof is burned off as the compound is deposited onto the substrate.

A variety of materials that comprise both volatile and involatile oxides may be deposited in accordance with the invention. Accordingly, oxides of Tl—Ba—Ca—Cu, preferably $TlBa_2Ca_{n-1}Cu_nO_{2n+3}$, where n=1, 2, 3 or 4; $Tl_2Ba_2Ca_{n-1}Cu_nO_{2n+4}$, where n=1, 2, 3 or 4; and $Tl_{0.5}Pb_{0.5}Sr_2Ca_{n-1}Cu_nO_{2n+3}$, where n=1, 2 or 3; most preferably $TlBa_2CaCu_2O_7$, $TlBa_2Ca_2Cu_3O_9$, and $TlBa_2(Ca_{1-x}Y_x)Cu_2O_7$ wherein x=0 to 0.6 are employed.

Deposition of oxides of TlBaCaCu to provide thin films of, for example, $TlBa_2CaCu_2O_7$, $TlBa_2Ca_2Cu_3O_9$, $TBa_2CaCu_2O_8$, $Tl_2Ba_2Ca_2Cu_3O_{10}$, and $TlBa_2(Ca_{1-x}Y_x)Cu_2O_7$ wherein x=0 to 0.6 is accomplished by sputter deposition of Ba, Ca and Cu from oxide targets in the presence of $Tl_2O$ vapor. The amounts of Ba, Ca and Cu in the target depends on the composition sought in the Tl—Ba—Ca—Cu thin films. Accordingly, targets of $Ba_2CaCu_2O_8$ are used in forming $TlBa_2CaCu_2O_7$ and $TlBa_2CaCu_2O_8$ films. Targets of $Ba_2Ca_2Cu_3O_x$ are used in forming $TlBa_2Ca_2Cu_3O_9$ and $Tl_2Ba_2Ca_2Cu_3O_{10}$, and targets of $Ba_2(Ca_{1-x}Y_x)Cu_2O_7$ are used to produce $TlBa_2(Ca_{1-x}Y_x)Cu_2O_7$, wherein x=0 to 0.6 films.

Generally, and in accordance with the invention, a substrate to be coated with the film is mounted onto a substrate block heater. The substrate-heater assembly is placed into a sputtering chamber that contains the desired atmosphere for deposition. The choice of substrate may vary depending on the film that is to be deposited, provided that the substrate and film are chemically compatible, i.e., do not chemically react with each other. Where oxide materials such as Tl—Ba—Ca—Cu are deposited, suitable substrates include $LaAlO_3$, $NdGaO_3$, $SrTiO_3$, preferably $LaAlO_3$ and $NdGaO_3$.

Together with the substrate heater assembly, separate sources of the involatile and the volatile oxides that provide the film are placed into a sputtering deposition chamber. Typically, the sources of involatile oxides are targets that contain those oxides. The targets are vaporized by conventional methods such as radio frequency sputtering or laser ablation to provide the relatively involatile oxides to the substrate. Such relatively involatile oxides comprise oxides of Ba, Ca and Cu, for example, BaO, CaO and CuO.

The separate source of the volatile oxides, for example, PbO and $Tl_2O$, to be deposited onto the substrate can be heated, for example, in the deposition chamber to volatilze those oxides for deposition onto the film.

EXAMPLE 1

A thin film of $TlBa_2CaCu_2O_7$ on a $LaAlO_3$ substrate was prepared. A 12 mm square [100] oriented single crystal $LaAlO_3$ substrate 0.5 mm thick was ultrasonically cleaned in VLSI (very large scale integration) grade 1,1,1-trichloroethane for 5 minutes. Without drying, the substrate was immersed in VLSI grade acetone with ultrasonic agitation for 5 minutes. Without drying, the substrate then was immersed in VLSI grade isopropanol with ultrasonic agitation. Finally, the substrate was spray rinsed with VLSI grade isopropanol and blown dry with clean filtered nitrogen.

After cleaning, the substrate was mounted onto the solid nickel (resistively heated) substrate heater block with silver paint. The substrate heater/holder assembly was placed into the vacuum sputter deposition chamber and electrical connections to the resistive heating element were made. A thermocouple temperature probe (standard type K inconel sheathed thermocouple) was inserted into the heater block to provide a temperature signal for a standard feedback type programmable temperature controller (model 818P4 from Eurotherm Corp., 11485 Sunset Hills Rd., Reston, Va. 22090-5286). The sputtering chamber was equipped with two standard rf magnetron sputter guns (model TRS-5M from Kurt J. Lesker Co., 1515 Worthington Ave., Clairton, Pa. 15025) with a 3" (7.6 cm) diameter $Ba_2CaCu_2O_x$ target in each gun. The targets were made by standard hot pressing of a stoichiometric powder mixture of the individual oxides (BaO, CaO, and CuO). The guns were oriented in an "off-axis" configuration to reduce negative ion bombardment effects on the substrates.

A separate vapor source of $Tl_2O$ from either $Tl_2O_3$ or $Tl_2O$ powder was included in the sputtering chamber. The vapor source was a hollow crucible of nickel that was filled with either $Tl_2O_3$ or $Tl_2O$ powder. The nickel was heated by standard resistive heating elements. The vapor source was placed into the sputtering chamber directly below the substrate heater. A thermocouple temperature probe (standard type K inconel sheathed thermocouple) was inserted into the nickel crucible to provide a temperature signal for a standard feedback type programmable temperature controller.

The sputtering chamber was evacuated to less than $10^{-5}$ torr ($1.33 \times 10^{-3}$ Pa) by a standard turbo pump (model TPU 330 with a TCP 305 electronic drive from Balzers, 8 Sagamore Park Rd., Hudson, N.H. 03051) backed by a standard chemical series mechanical pump (model 2020CP from Alcatel vacuum Products, 40 Pond Rd., South Shore Park, Hingham, Mass. 02043). An Ar gas flow of 25 sccm (standard cubic centimeters per minute) and an $O_2$ gas flow of 25 sccm into the sputtering chamber were established by standard mass flow controllers. The electronic drive unit for the turbo pump was placed in the pressure feedback mode to control the sputtering pressure at 200 mtorr (26.7 Pa).

The substrate heater temperature and the vapor source temperature were raised to 550° C. at a rate of 15° C./min After reaching 550°C. the temperature of the vapor source was adjusted to give a deposition rate of 0.6 Å/sec (0.06 nm/sec.) on a quartz crystal rate monitor (model IC6000 from Leybold Inficon, 6500 Fly Rd., East Syracuse, N.Y. 13057) located near the substrate heater. The rf magnetron sputter guns then were activated with 100 watts of rf power to each gun to generate a deposition rate of about 450 Å/hr (45 nm/hr) at the substrate. After one hour, the rf power was turned off, the gas flows turned off, and the system was backfilled with $O_2$ to a pressure of 500 torr ($6.65 \times 10^4$ Pa). At the same time, the substrate heater and the vapor source began cooling back to room temperature at about 15° C./min.

Figure 1B:
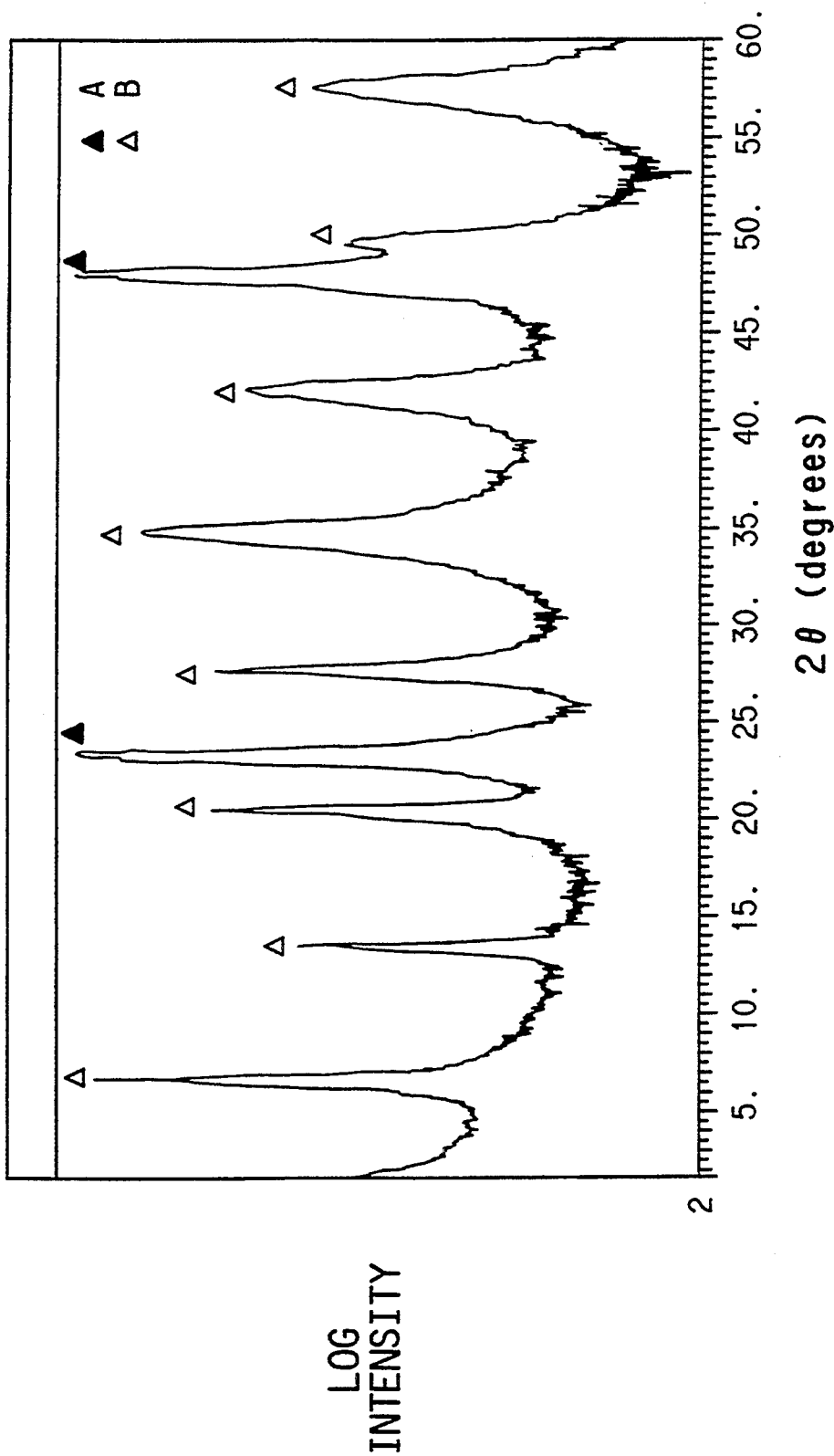
Figure 2:
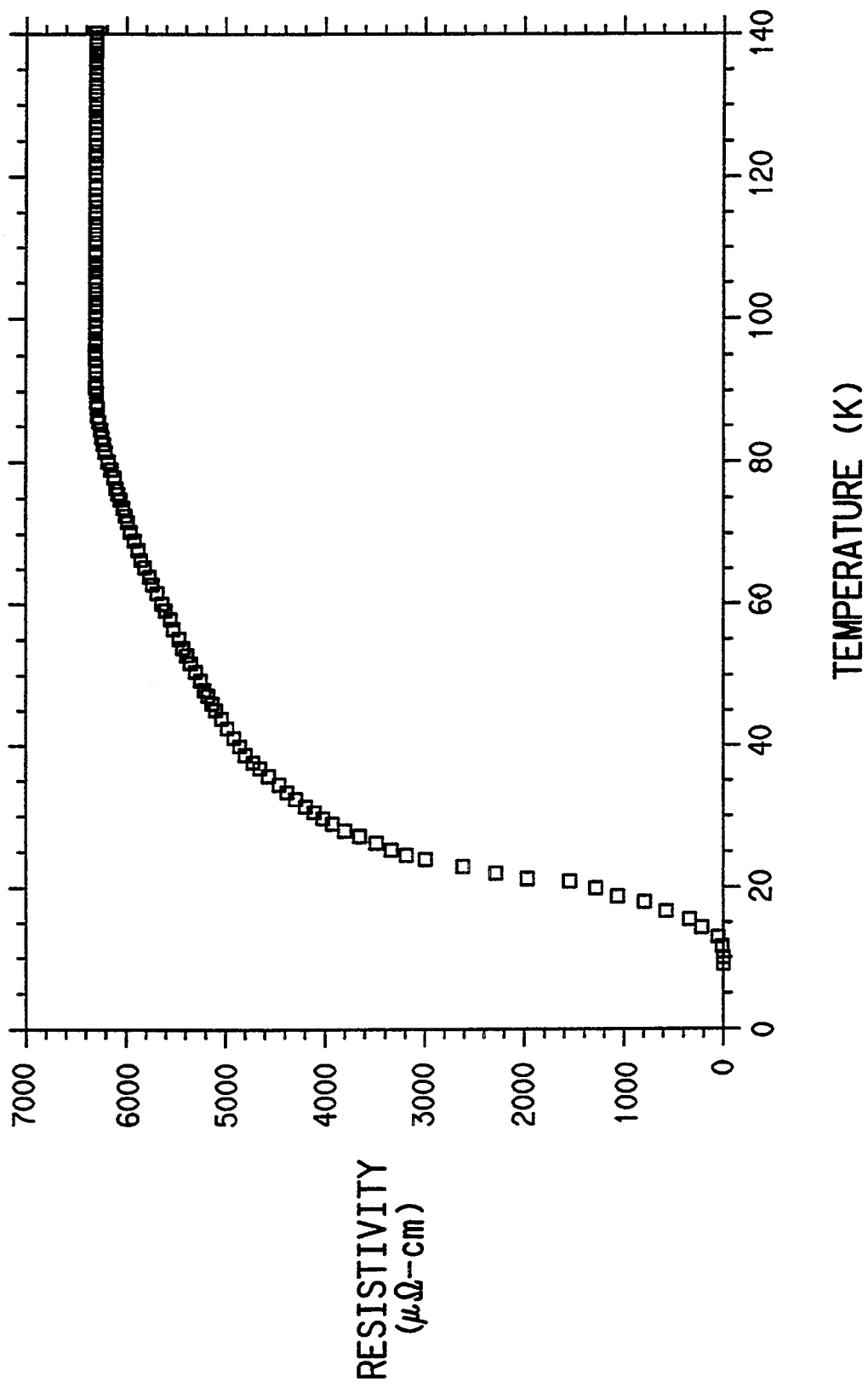
FIG. 2 shows a plot of the resistivity versus temperature for a $TlBa_2CaCu_2O_7$ film made by the present invention.

The x-ray diffraction pattern of the film produced by the in-situ method of this example is shown in FIG. 1. The black triangles A represent $LaAlO_3$ (h00) and the white triangles B represent the 1212 (00l) phase of $TlBa_2CaCu_2O_7$. The diffraction pattern showed well defined peaks of the $TlBa_2CaCu_2O_7$ phase with no other phases detected. These peaks also showed that the film is highly oriented with the c-axis perpendicular to the substrate surface. The resistivity versus temperature for a similar film which was grown at 565° C. instead of 550° C. is shown in FIG. 2. The film showed an onset of superconductivity at about 80° K., but did not reach zero resistance until about 8° K.

EXAMPLE 2.

The procedure of Example 1 was followed except that $Ba_2(Ca_{0.6}Y_{0.4})Cu_2O_x$ sputtering targets were used (in place of $Ba_2CaCu_2O_x$), $Ar/N_2O$ was used in place of $Ar/O_2$ as the sputtering gas mixture, the thallium oxide evaporation rate was increased to 1.0 Å/sec (0.1 nm/sec), and deposition was followed by raising the substrate heater temperature to 725° C. in 500 torr ($6.65 \times 10^4$ Pa) of $O_2$ and holding at that temperature for 240 minutes before cooling to room temperature.

Figure 3:
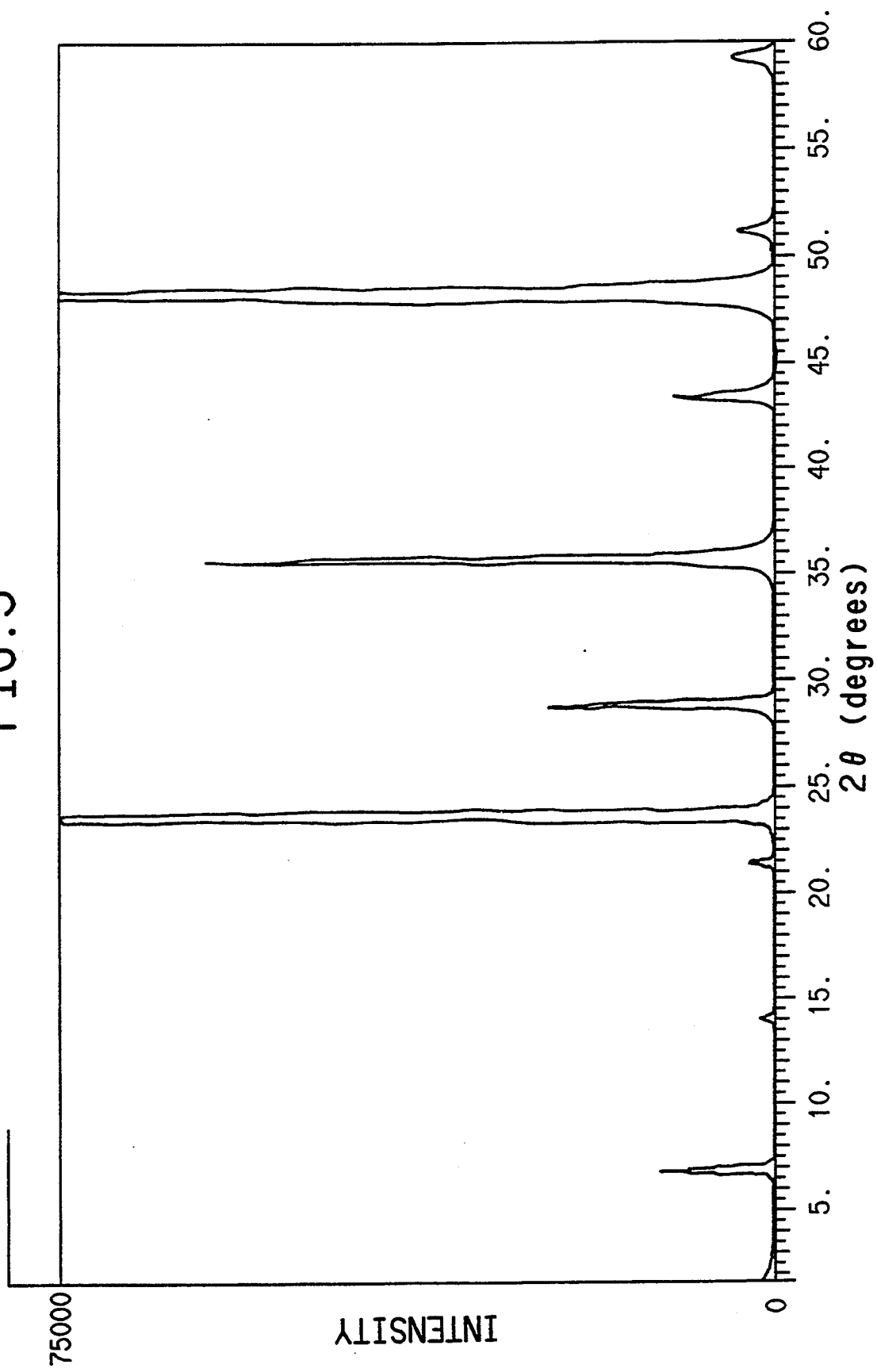
FIG. 3 shows an x-ray diffraction pattern of a superconducting thin film made by the invention.
Figure 4:
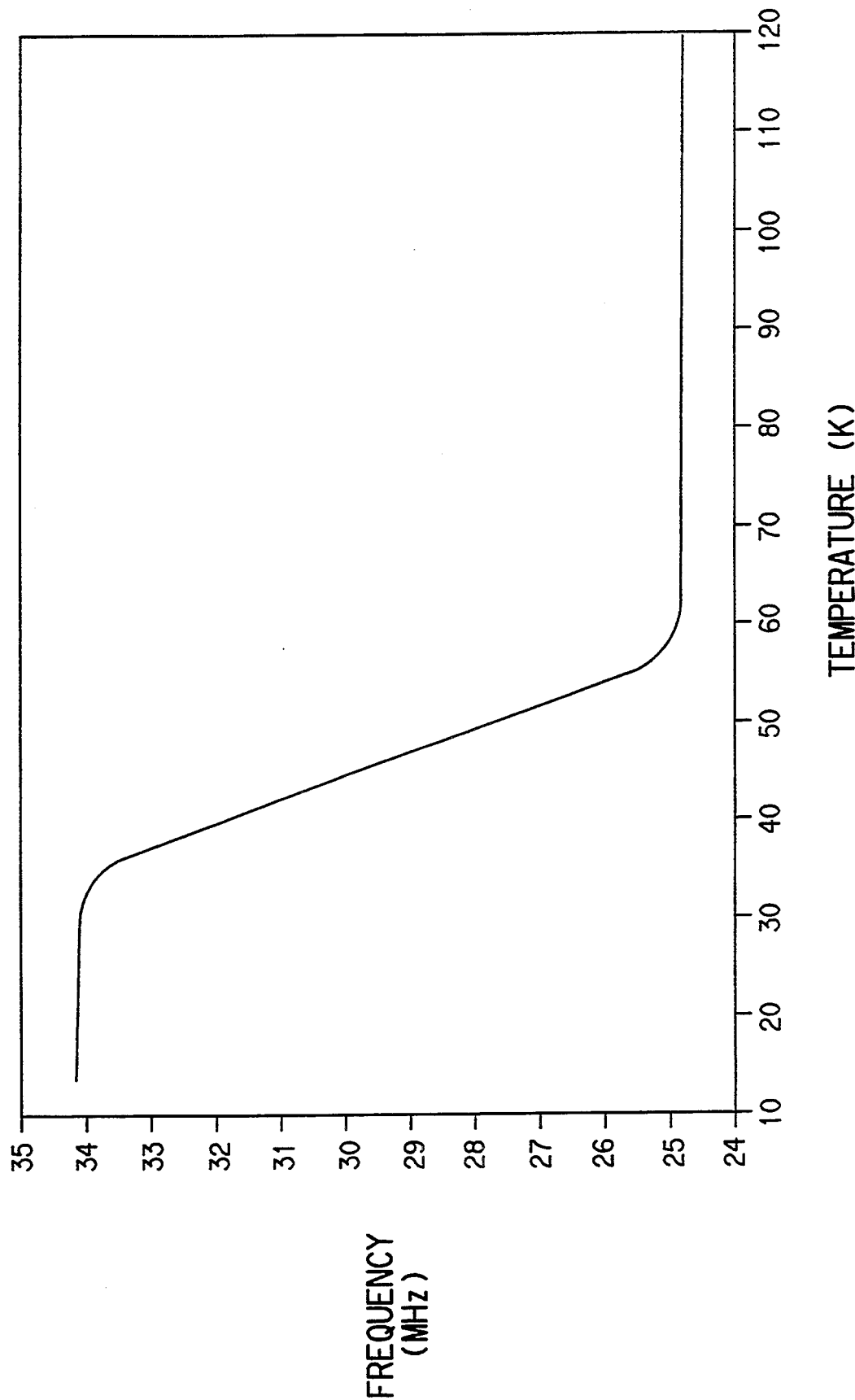
FIG. 4 shows a plot of the inductive frequency response vs. temperature indicating the onset of superconductivity in a film made by the present invention.

The x-ray diffraction pattern of the $TlBa_2(Ca_{0.6}Y_{0.4})Cu_2O_7$ film produced by this example is shown in FIG. 3. The diffraction pattern showed well defined peaks of the $TlBa_2(Ca_{0.6}Y_{0.4})Cu_2O_7$ phase with no other phases detected. These peaks also showed that the film is highly oriented with the c-axis perpendicular to the substrate surface. This x-ray diffraction pattern was nearly identical to that shown for the Example 1 except that the crystalline lattice constant was reduced due to the partial substitution of Y for Ca in the lattice and the increased oxygen content due to the 240 minute soak in $O_2$ after deposition. An inductive eddy current measurement (taken using the model 7500 from Lake Shore Cryotronics, 64 East Walnut St, Westerville, Ohio 43081-2399) of the film produced by Example 2 is shown in FIG. 4. FIG. 4 showed the onset of superconductivity in this sample at about 55° K.

EXAMPLE 3

The procedure of Example 1 was followed except that $Pb_{0.5}Sr_2Ca_2Cu_3O_x$ sputtering targets were used (in place of $Ba_2CaCu_2O_x$), $Ar/N_2O$ was used in place of $Ar/O_2$ as the sputtering gas mixture, and the thallium oxide evaporation rate was increased to 1.0 Å/sec (0.1 nm/sec).

Figure 5:
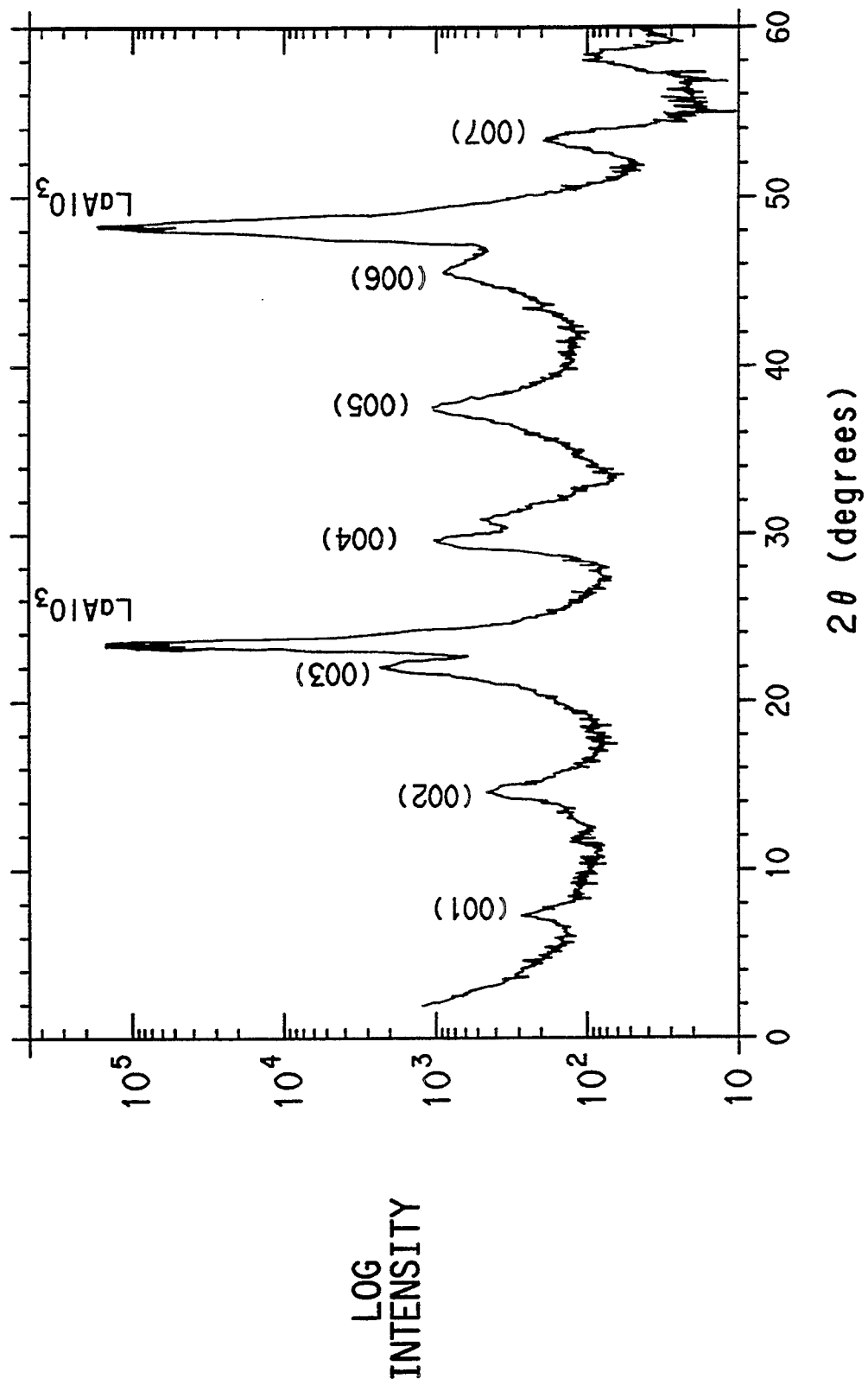
FIG. 5 shows an x-ray diffraction pattern on a log scale of a $Tl_{0.5}Pb_{0.5}Sr_2CaCu_2O_7$ film made by the present invention.

The x-ray diffraction pattern of the $Tl_{0.5}Pb_{0.5}Sr_2CaCu_2O_7$ film produced by this example is shown in FIG. 5. The diffraction pattern showed well defined peaks of the $Tl_{0.5}Pb_{0.5}Sr_2CaCu_2O_7$ phase. The excess Ca and Cu from the targets relative to the desired $Tl_{0.5}Pb_{0.5}Sr_2CaCu_2O_7$ phase likely formed a CaCuOxide phase intermixed with the desired $Tl_{0.5}Pb_{0.5}Sr_2CaCu_2O_7$ phase. The x-ray diffraction peaks also showed that the film is highly oriented with the c-axis perpendicular to the substrate surface.

EXAMPLE 4

The procedure of Example 1 was followed except that $Pb_{0.7}Sr_2CaCu_2O_x$ sputtering targets were used (in place of $Ba_2CaCu_2O_x$), $Ar/N_2O$ was used in place of $Ar/O_2$ as the sputtering gas mixture, the substrate temperature was increased to 595° C., the depostion time was increased to 3 hours, the thallium oxide evaporation rate was decreased to 0.4 Å/sec (0.04 nm/sec), and the cool down after depostion was carried out at 20° C./min in $N_2O$ at 500 torr ($6.65 \times 10^4$ Pa).

Figure 6:
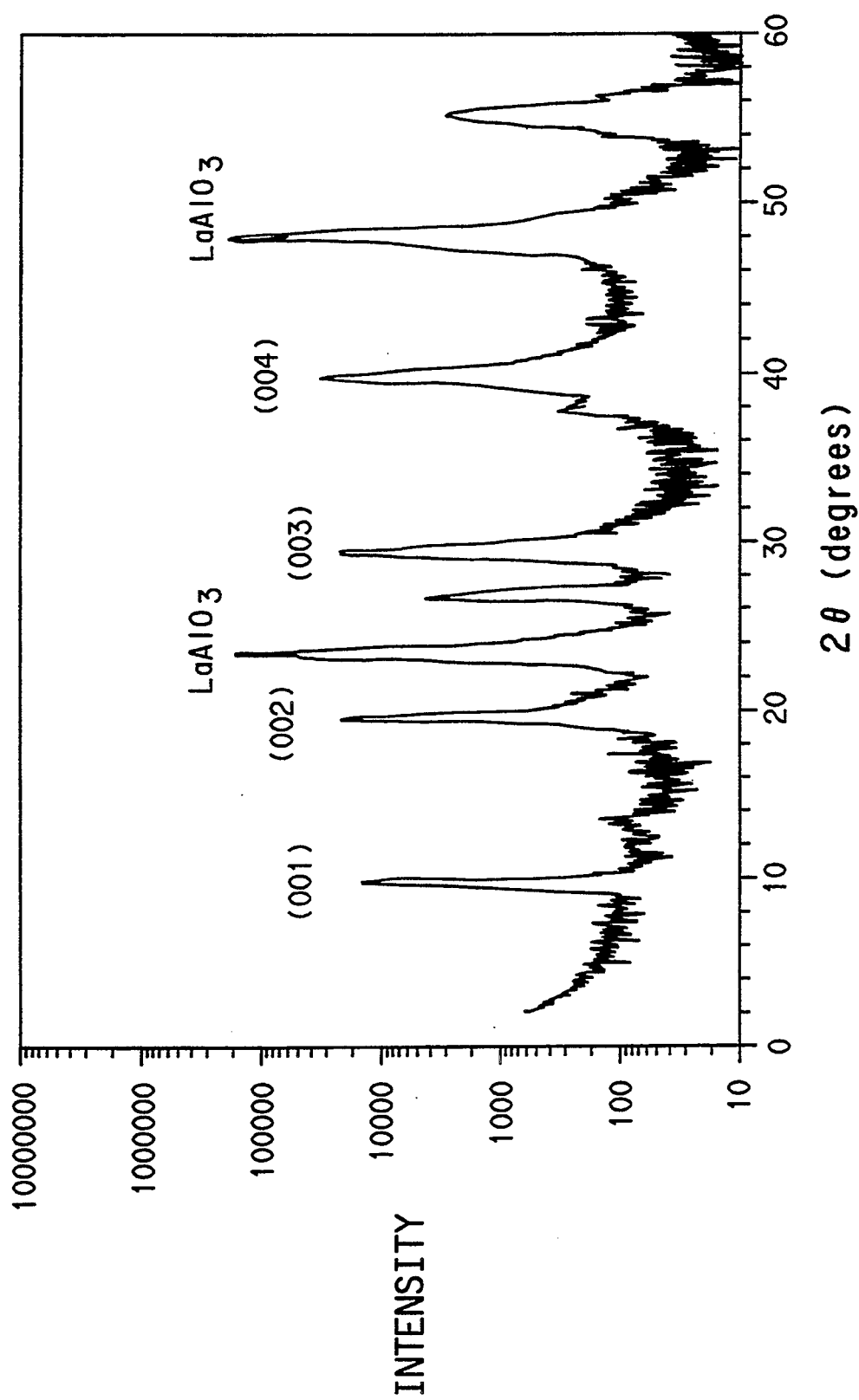
FIG. 6 shows an x-ray diffraction pattern on a log scale of a conducting (non-superconducting) $Tl_{0.5}Pb_{0.5}Sr_2CuO_5$ film made by the present invention.

The x-ray diffraction pattern of the $Tl_{0.5}Pb_{0.5}Sr_2CuO_5$ film produced by this example is shown in FIG. 6. The diffraction pattern showed well defined peaks of the $Tl_{0.5}Pb_{0.5}Sr_2CuO_5$ phase. The excess Ca and Cu from the targets relative to the desired $Tl_{0.5}Pb_{0.5}Sr_2CuO_5$ phase likely formed a CaCuOxide phase intermixed with the desired $Tl_{0.5}Pb_{0.5}Sr_2CuO_5$ phase. The x-ray diffraction peaks also showed that the film is highly oriented with the c-axis perpendicular to the substrate surface.

Figure 7:
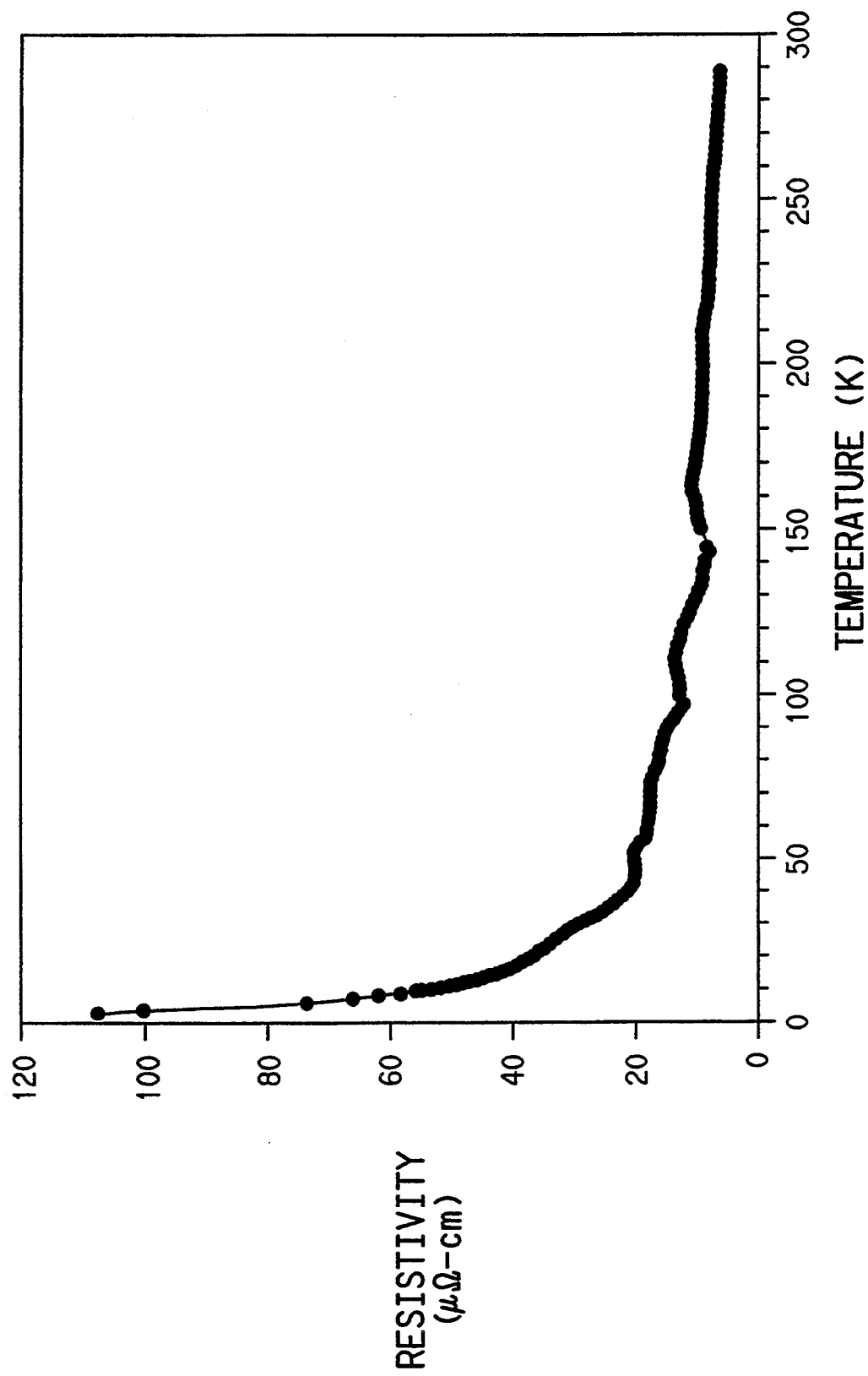
FIG. 7 shows the resistivity vs temperature of a $Tl_{0.5}Pb_{0.5}Sr_2CaCu_2O_7$ film made by the present invention.

The $Tl_{0.5}Pb_{0.5}Sr_2CuO_5$ phase is known to be a conducting (but not superconducting) material with a perovskite-related crystal structure (see for example T. Kaneko, A. Ichinose, T. Wada, K. Hamada, H. Yamauchi, and S Tanaka, in "Advances in Superconductivity III", K. Kajimura and H. Hayakawa (Eds.), Springer-Verlag, N.Y., p. 291, 1991.) FIG. 7 shows the resistivity vs temperature of this sample indicating an increasing resistance with decreasing temperature.

EXAMPLE 5

The procedure of Example 1 was followed except that Ta sputtering targets were used (in place of $Ba_2CaCu_2O_x$), a r-plane sapphire ($Al_2O_3$) substrate was used (in place of $LaAlO_3$), the Ar gas flow rate was increased to 45 sccm, the $O_2$ flow rate was decreased to 5 sccm, the substrate temperature was increased to 580° C., the depostion time was increased to 3 hours, the thallium oxide evaporation rate was decreased to 0.2 Å/sec (0.02 nm/sec), and the cool down after depostion was carried out at 20° C./min in $O_2$ at 500 torr ($6.65 \times 10^4$ Pa).

Figure 8:
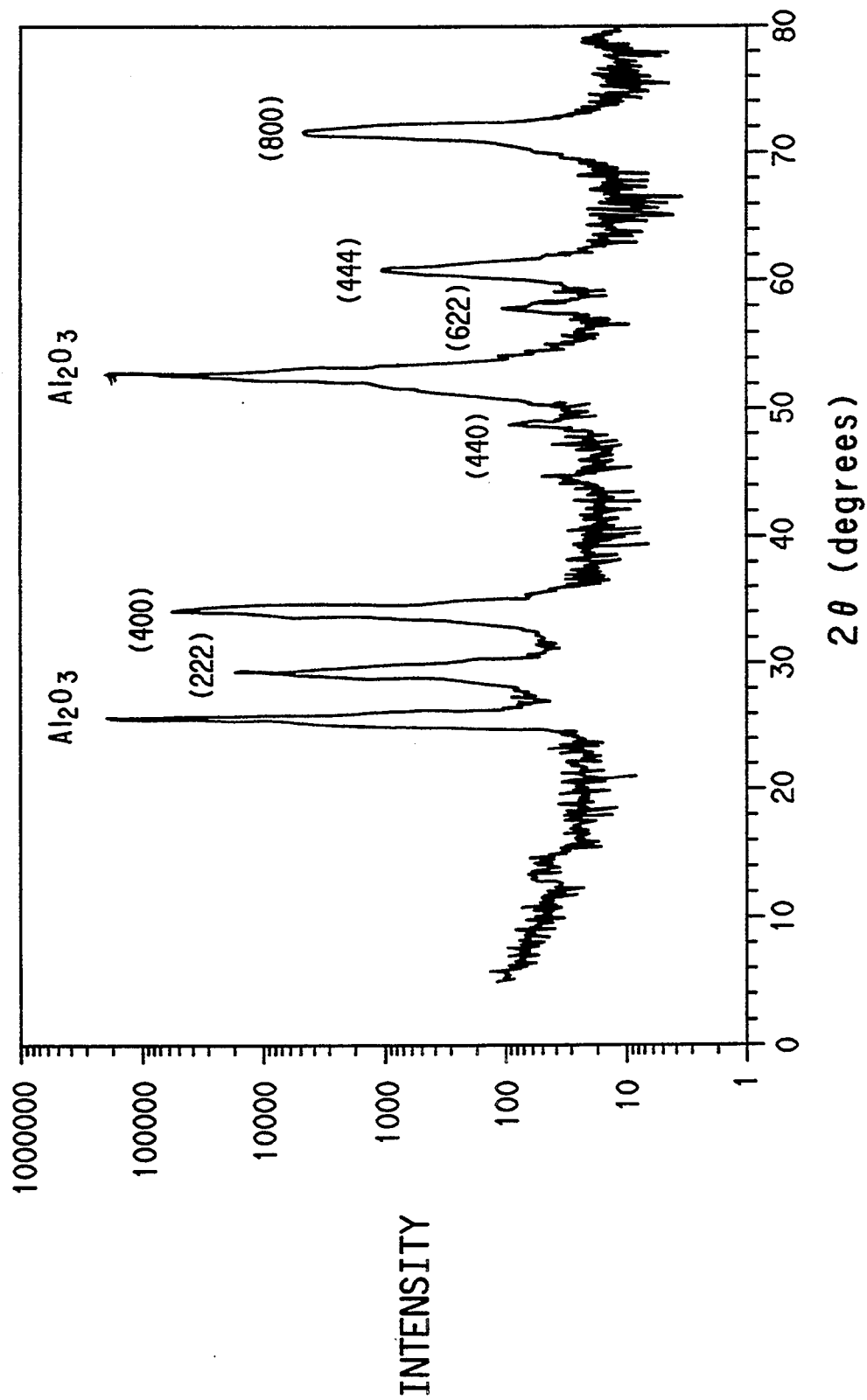
FIG. 8 shows an x-ray diffraction pattern on a log scale of a ferroelectric $Tl_2Ta_2O_6$ film made by the present invention on a r-plane sapphire ($Al_2O_3$) substrate.

The x-ray diffraction pattern of the desired $Tl_2Ta_2O_6$ film produced by this example is shown in FIG. 8. The diffraction pattern showed well defined peaks of the $Tl_2Ta_2O_6$ phase with the pyrochlore crystal structure. The x-ray diffraction peaks also showed that the film has two preferred orientations; one with the (100) axis perpendicular to the substrate and one with the (111) axis perpendicular to the substrate surface. The $Tl_2Ta_2O_6$ phase is known to be a ferroelectric insulator material with a ferroelectric transition temperature of 560K (M. Ganne and M. Tournoux, Mat. Res. Bull., Vol. 10, pp 1313-1318 (1975)).

Other embodiments of the invention will be apparent to those skilled in the art from consideration of the specification, or from practice of the invention disclosed herein. It is intended that the specification and examples be considered as exemplary only, with the scope and spirit of the invention being indicated by the following claims.

What is claimed is:

1. A vapor deposition method of forming in-situ a crystalline thin film of formula $A_yB_z$ wherein A is a relatively volatile oxide that is susceptible to evaporative loss from said thin film during vapor deposition, B is an involatile oxide, y is the number of moles of relatively volatile A, and z is the number of moles of involatile B, and wherein relatively volatile oxide A and involatile B have deposition rates such that the deposition rate of relatively volatile A is at least 1.1 times the product of the deposition rate of involatile B times the stoichiometric ratio y/z of relatively volatile A to involatile B comprising, providing a first source of said relatively volatile A,
providing a second source of said involatile B,
depositing said involatile B from said second source onto a substrate while concurrently depositing a sufficient amount of said relatively volatile A from said first source onto said substrate to provide a crystalline thin film of formula $A_yB_z$.

2. The method of claim 1 wherein said relatively volatile A and involatile B form a crystalline thin film having a perovskite-related structure or a pyrochlore structure.

3. The method of claim 1 wherein at least one of said relatively volatile oxides is selected from the group consisting of an oxide of Pb and Tl.

4. The method of claim 2 wherein at least one of said relatively volatile oxides is selected from the group consisting of an oxide Pb and Tl.

5. The method of claim 1, 2 or 3 wherein said relatively volatile A and involatile B form a crystalline thin film which is conducting, superconducting or ferroelectric.

6. The method of claim 1 wherein said film of the formula $A_yB_z$ is selected from the group consisting of $TlBa_2CaCu_2O_7$, $TlBa_2Ca_2Cu_3O_9$, $Tl_2Ba_2CaCu_2O_8$, $Tl_2Ba_2Ca_2Cu_3O_{10}$, $TlBa_2(Ca_{1-x}Y_xCu_2O_7$ wherein x is 0 to 0.6, and $Tl_2Ta_2O_6$, said source of relatively volatile A is $Tl_2O$, and said source of involatile B is selected from the group consisting of an oxide of Ba, Ca, Ta, Y and Cu.

7. The method of claim 1 wherein said film of the formula $A_yB_z$ is selected from the group consisting of $Tl_{0.5}Pb_{0.5}Sr_2Ca_{n-1}Cu_nO_{2n+3}$ wherein n is 1, 2 or 3, said source of relatively volatile A is $Tl_2O$ and PbO and said source of involatile B is selected from the group consisting of an oxide of Sr, Ca and Cu.

8. The method of claims 6 or 7 wherein said substrate is heated to a temperature of from about 400° C. to about 700° C.

9. The method of claim 8 wherein said vapor deposition occurs in an atmosphere of a mixture of an inert gas together with either oxygen or $N_2O$.

10. The method of claim 9 wherein the partial pressure of said oxygen or $N_2O$ in said atmosphere is sufficient to reduce evaporative loss of Tl oxide from said film during deposition.

11. The method of claim 10 wherein said partial pressure is 3 to 133 Pa.

12. The method of claim 8 wherein said $Tl_2O$ is deposited at the rate of 10 to 360 nm per hour.

* * * * *